United States Patent
Zhang et al.

(10) Patent No.: US 8,642,369 B2
(45) Date of Patent: Feb. 4, 2014

(54) VERTICALLY STRUCTURED LED BY INTEGRATING NITRIDE SEMICONDUCTORS WITH ZN(MG,CD,BE)O(S,SE) AND METHOD FOR MAKING SAME

(75) Inventors: Jizhi Zhang, Arcadia, CA (US); Jin Joo Song, Brea, CA (US)

(73) Assignee: ZN Technology, Inc., Brea, CA (US)

( * ) Notice: Subject to any disclaimer, the term of this patent is extended or adjusted under 35 U.S.C. 154(b) by 225 days.

(21) Appl. No.: 12/397,224

(22) Filed: Mar. 3, 2009

(65) Prior Publication Data

US 2010/0224891 A1    Sep. 9, 2010

(51) Int. Cl.
    *H01L 21/00*     (2006.01)
(52) U.S. Cl.
    USPC ............... 438/47; 438/104; 257/E33.064
(58) Field of Classification Search
    USPC ............. 257/43, 78, 98, 94, 103, E33.064;
                    438/47, 104, 29, 455, 459
    See application file for complete search history.

(56) References Cited

U.S. PATENT DOCUMENTS

| | | | | |
|---|---|---|---|---|
| 5,889,295 | A * | 3/1999 | Rennie et al. | 257/96 |
| 6,255,129 | B1 * | 7/2001 | Lin | 438/26 |
| 6,847,056 | B2 * | 1/2005 | Noto et al. | 257/98 |
| 6,869,820 | B2 * | 3/2005 | Chen | 438/79 |
| 7,649,193 | B2 * | 1/2010 | Wirth | 257/12 |
| 7,692,204 | B2 * | 4/2010 | Stein et al. | 257/98 |
| 7,741,637 | B2 | 6/2010 | Nakahara et al. | |
| 7,939,844 | B2 * | 5/2011 | Hahn et al. | 257/99 |
| 2001/0000916 | A1 * | 5/2001 | Kadota | 257/43 |
| 2004/0089868 | A1 * | 5/2004 | Hon et al. | 257/79 |
| 2005/0205875 | A1 * | 9/2005 | Shei et al. | 257/79 |
| 2005/0242357 | A1 | 11/2005 | Uematsu et al. | |
| 2006/0043337 | A1 * | 3/2006 | Sakane et al. | 252/301.4 F |
| 2006/0081873 | A1 | 4/2006 | Osinsky et al. | |
| 2006/0214576 | A1 * | 9/2006 | Takahashi et al. | 313/506 |
| 2007/0001186 | A1 * | 1/2007 | Murai et al. | 257/98 |
| 2008/0073658 | A1 * | 3/2008 | Wirth | 257/96 |
| 2008/0142810 | A1 * | 6/2008 | Tompa et al. | 257/76 |
| 2009/0020776 | A1 * | 1/2009 | Lin et al. | 257/98 |
| 2009/0026473 | A1 * | 1/2009 | Jiang et al. | 257/98 |

(Continued)

FOREIGN PATENT DOCUMENTS

JP    2007-329353    12/2007

OTHER PUBLICATIONS

International Search Report on corresponding PCT application (PCT/US2010/026118) from International Searching Authority (KR) dated Oct. 19, 2010.

(Continued)

*Primary Examiner* — Daniel Luke
*Assistant Examiner* — Joseph C Nicely
(74) *Attorney, Agent, or Firm* — Klein, O'Neill & Singh, LLP

(57) ABSTRACT

A light emitting diode (LED) with a vertical structure, including electrical contacts on opposing sides, provides increased brightness. In some embodiments an LED includes a nitride semiconductor light emitting component grown on a sapphire substrate, a Zn(Mg,Cd,Be)O(S,Se) assembly formed on the nitride semiconductor component, and a further Zn(Mg Cd,Be)O(S,Se) assembly bonded on an opposing side of the light emitting component, which is exposed by removing the sapphire substrate. Electrical contacts may be connected to the Zn(Mg,Cd,Be)O(S,Se) assembly and the further Zn(Mg, Cd,Be)O(S,Se) assembly. Herein Zn(Mg,Cd,Be)O(S,Se) is a II-VI semiconductor satisfying a formula $Zn_{1-a-b-c}Mg_a Cd_b Be_c O_{1-p-q} S_p Se_q$, wherein a=0~1, b=0~1, c=0~1, p=0~1, and q=0~1.

7 Claims, 10 Drawing Sheets

(56) References Cited

U.S. PATENT DOCUMENTS

| | | | |
|---|---|---|---|
| 2010/0001301 A1* | 1/2010 | Karg et al. | 257/98 |
| 2010/0053931 A1* | 3/2010 | Carroll et al. | 362/84 |
| 2010/0136721 A1* | 6/2010 | Song | 438/22 |
| 2011/0101399 A1* | 5/2011 | Suehiro et al. | 257/98 |
| 2012/0199809 A1* | 8/2012 | Schmidt et al. | 257/9 |

OTHER PUBLICATIONS

Written Opinion on corresponding PCT application (PCT/US2010/026118) from International Searching Authority (KR) dated Oct. 19, 2010.

* cited by examiner

VERTICALLY STRUCTURED LED BY INTEGRATING NITRIDE SEMICONDUCTORS WITH ZN(MG,CD,BE)O(S,SE) AND METHOD FOR MAKING SAME

BACKGROUND OF THE INVENTION

The present invention relates generally to light emitting diodes (LEDs) and more particularly to LEDs comprised of a nitride semiconductor light emitting component and a conductive group II-V semiconductor, preferably satisfying a formula $Zn_{1-a-b-c}Mg_aCd_bBe_cO_{1-p-q}S_pSe_q$, wherein $a=0\sim1$, $b=0\sim1$, $c=0\sim1$, $p=0\sim1$, and $q=0\sim1$.

Most LED structures composed of group III nitride semiconductors are grown on sapphire substrates. The drawback of sapphire in this application is that it is electrically an insulator. As a result, a positive electrode 100 and a negative electrode 500 of an LED structure can not sandwich a light-emitting component 300 and have to be made on the same side of a sapphire substrate 401, as typically shown in FIG. 2, which is known as lateral injection structure.

LEDs of the said lateral injection structure are known to have low wall-plug efficiency, which results from three major facts. First, the effective current injection area or a light emitting area 310 is restricted by the area of the positive electrode 100. In the lateral injection structure, the positive electrode 100, having poor transparency, can only be fabricated to cover a small portion of a p-type nitride semiconductor 301, or most of the light will not be extracted. Because the p-type nitride semiconductor 301 is a poor semiconductor, significantly less conductive than an n-type nitride semiconductor 303, the injected current can not be effectively spread laterally and the current injection is only restricted under the positive electrode 100. Second, a significant amount of output light is blocked by the electrode 100. Third, LEDs of the lateral injection structure have an additional series resistance, caused by a current crowding effect in a thin n-type nitride semiconductor 303 as the electrical current passes by laterally. This inevitably results in a significant reduction of light emission efficiency due to thermal effects.

If a highly conductive, transparent material replaces the insulative sapphire substrate 401 and another highly conductive, transparent material is attached onto the top of the less conductive, p-type layer 301, then a vertically structured LED is generally formed as shown in FIG. 3 (although, it should be emphasized, not as later specifically discussed with respect to FIG. 3). Compared to the said lateral injection structure, the vertically structured LED has an enlarged effective current injection area or light emitting area 310 and an enhanced ratio of the output light to the light blocked by the positive electrode 100. Also there is no more considerable said additional series resistance associated with the lateral transport in the n-type nitride semiconductor 303. Therefore, the vertically structured LED has a significantly improved wall plug efficiency. The effective current injection area or light emitting area 310 herein has the same normal as that of the sapphire substrate surface.

Theoretically, GaN could be an ideal substrate to replace the insulator, sapphire substrate 401 for the said vertical LED structure. However, high crystalline, high conductive GaN substrates are not available with low cost. Moreover, homoepitaxy growth of nitride LED structure on GaN substrates has so far been considered very challenging.

SiC substrate has been used as a conductive substrate for the said vertical LED structure. Yet, the bulk growth of SiC is very difficult since the melting point of hexagonal SiC is over 3000° C. and, consequently, SiC substrates are expensive. There are also significantly large a and c axis lattice parameter mismatches between SiC and GaN, 3.6% and 94%, respectively.

Silicon could also be another alternative conductive substrate for vertical LED. However, it is a narrow bandgap semiconductor and known to significantly absorb ultraviolet, violet, blue, green, yellow, red, and near infrared light. Therefore nitride LEDs formed on silicon substrates have low efficiency.

SUMMARY OF THE INVENTION

This invention provides a vertically structured LED. In some aspects the invention provides an LED with improved brightness and reliability by integrating a light-emitting component made from nitride semiconductors satisfying a formula $Al_xGa_yIn_{1-x-y}N$, inclusive of $x=0$, $y=0$ and $x=y=0$ with a conductive group II-VI semiconductor satisfying a formula $Zn_{1-a-b-c}Mg_aCd_bBe_cO_{1-p-q}S_pSe_q$, wherein $a=0\sim1$, $b=0\sim1$, $c=0\sim1$, $p=0\sim1$, and $q=0\sim1$. Hereafter, Zn(Mg,Cd,Be)O(S,Se) is used to denote any of the said group II-VI semiconductor family satisfying the formula $Zn_{1-a-b-c}Mg_aCd_bBe_cO_{1-p-q}S_pSe_q$, wherein $a=0\sim1$, $b=0\sim1$, $c=0\sim1$, $p=0\sim1$, and $q=0\sim1$. In particular, the flow pattern of electrical current in the said LED is improved by employing at least one conductive Zn(Mg,Cd,Be)O(S,Se) assembly composed of at least one highly conductive Zn(Mg,Cd,Be)O(S,Se) layer attached to the said light-emitting component. The said conductive Zn(Mg,Cd,Be)O(S,Se) assembly may contain several Zn(Mg,Cd,Be)O(S,Se) layers or bulks of various shapes.

A first manufacturing method is provided for forming a first vertically structured LED that includes two conductive Zn(Mg,Cd,Be)O(S,Se) assemblies, generally comprising:

Forming a light-emitting component made from nitride semiconductors satisfying the formula $Al_xGa_yIn_{1-x-y}N$, inclusive of $x=0$, $y=0$, and $x=y=0$ preferably on a sacrificial substrate that is to be removed. The sacrificial substrate is preferably sapphire or silicon, but could be some other type of substrate. In some embodiments, a thin buffer layer is preferably formed on the sacrificial substrate prior to forming the light-emitting component. The light-emitting component includes an n-type nitride semiconductor, a nitride active region composed of one quantum well (QW) or multiple QWs, and a p-type nitride semiconductor, which are subsequently formed on the said thin buffer layer. It may also include an n$^+$ nitride layer formed on the said p-type nitride semiconductor. Additionally, the light-emitting component has polarity because it contains a p-n junction;

Forming a first conductive Zn(Mg,Cd,Be)O(S,Se) assembly that has an n$^+$ Zn(Mg,Cd,Be)O(S,Se) layer attached onto the nitride semiconductor side (not the side on the said substrate) of the light-emitting component, wherein the said nitride semiconductor side is the positive side of the light-emitting component;

Removing the said sacrificial substrate and the said thin buffer layer. If a sapphire substrate is employed as the sacrificial substrate, then the sapphire substrate could be removed using, for example, a laser lift-off (LLO) process. With the LLO process for the sapphire substrate removal, the thin buffer layer is generally damaged during the laser lift-off process, therefore, the said n-type nitride semiconductor is exposed. In another aspect, if a silicon substrate is used as the sacrificial substrate, then the silicon wafer can be removed using, for example, selective wet etching or a combination of mechanical lapping and selective wet etching. This is followed by a short time dry etching to remove the said thin buffer layer so that the said n-type nitride semiconductor can be exposed For the sacrificial substrate removal, other methods may also be used, depending on the specific sacrificial substrate used;

Forming the second conductive Zn(Mg,Cd,Be)O(S,Se) assembly on the exposed side of the n-type nitride semiconductor after the sacrificial substrate removal. The exposed side of the n-type nitride semiconductor herein is the negative side of the light-emitting component; and Forming the positive and the negative electrodes attached to the first conductive Zn(Mg,Cd,Be)O(S,Se) and the second conductive Zn(Mg,Cd,Be)O(S,Se) assemblies, respectively. In some embodiments, one of the electrodes is made as a light reflector so that light extraction can be enhanced.

A second manufacturing method is provided for forming a second vertically structured LED of this invention, including one conductive Zn(Mg,Cd,Be)O(S,Se) assembly (namely, still called as the first conductive Zn(Mg,Cd,Be)O(S,Se) assembly). This method generally comprises:

Forming a light-emitting component made from nitride semiconductors satisfying the formula $Al_xGa_yIn_{1-x-y}N$, inclusive of x=0, y=0, and x=y=0 on a sacrificial substrate. The sacrificial substrate is preferably to be sapphire or silicon, but could be else. In some embodiments, a thin buffer layer is preferably formed on the sacrificial substrate prior to forming the said light-emitting component. The said light-emitting component includes an n-type nitride semiconductor, a nitride active region composed of one quantum well (QW) or multiple QWs and a p-type nitride semiconductor, which are subsequently formed on the said thin buffer layer. It may also include an $n^+$ nitride layer formed on the said p-type nitride semiconductor;

Forming the first conductive Zn(Mg,Cd,Be)O(S,Se) assembly that has an $n^+$ Zn(Mg,Cd,Be)O(S,Se) layer attached onto the nitride semiconductor side (not the substrate side) of the light-emitting component, wherein the said nitride semiconductor side is the positive side of the light-emitting component;

Removing the sacrificial substrate and the said thin buffer layer to expose the n-type nitride semiconductor; and Forming the positive electrode attached to the first conductive Zn(Mg,Cd,Be)O(S,Se) assembly and the negative electrode attached to the exposed side of the n-type nitride semiconductor. The said exposed side of the n-type nitride semiconductor herein is the negative side of the light-emitting component. One of the two electrodes is made as a light reflector so that light extraction can be enhanced.

The said Zn(Mg,Cd)O(S,Se) assemblies of this invention may contain at least a layer or a portion that is doped with phosphors. After absorption of the original light emitted from the said nitride active region, the phosphors remit lights of their own characteristic colors. The overall effect to an observer or a detector is that the color of the said original light is converted or blended. By choosing the proper phosphor type or types and controlling the corresponding amounts, the LED of this invention is capable of emitting light of various colors, such as infrared, red, yellow, green blue, violet, and ultraviolet portions of the electromagnetic spectrum. Herein Zn(Mg,Cd,Be)O(S,Se) is used as the phosphor host. The said phosphors are typically composed of at least one of the transition metals or rare earth ions of various types.

In another aspect, the vertically structured LED of this invention may employ at least one light scattering medium for LED brightness enhancement. The said light scattering medium or media may be used to reduce light trapped in the LED structure due to total internal reflection so that external quantum efficiency can be significantly improved. This may be implemented by roughening the interface between the first Zn(Mg,Cd,Be)O(S,Se) assembly 200 and the light-emitting component 300. This can also be implemented by roughening any surface of any Zn(Mg,Cd,Be)O(S,Se) and nitride layers of the said vertically structured LED. The roughening methods could be wet chemical etching, dry etching, growth parameter control, or other methods.

In another aspect the invention provides a light emitting diode (LED), comprising a nitride semiconductor light emitting component containing at least a p-type nitride semiconductor and an n-type nitride semiconductor, the nitride semiconductor light emitting component having a positive side and a negative side; a conductive Zn(Mg,Cd,Be)O(S,Se) assembly attached to the positive side of the nitride semiconductor light emitting component; a positive electrode coupled to the conductive Zn(Mg,Cd,Be)O(S,Se) assembly; and a negative electrode coupled to the negative side of the nitride semiconductor light emitting component.

Yet, in another aspect the invention provides a method of forming a light emitting diode (LED), comprising forming a light-emitting component made from nitride semiconductors satisfying the formula $Al_xGa_yIn_{1-x-y}N$, inclusive of x=0, y=0, and x=y=0, on a sacrificial substrate; forming a conductive Zn(Mg,Cd,Be)O(S,Se) assembly that has a $n^+$ Zn(Mg,Cd,Be)O(S,Se) layer on the light emitting component; removing the sacrificial substrate and a thin buffer layer thereon to expose a negative side of the light emitting component; forming a positive electrode coupled to the conductive Zn(Mg,Cd,Be)O(S,Se) assembly; and forming a negative electrode coupled to the negative side of the light emitting component.

Other systems, methods, features and advantages of the invention will be or become apparent to one with skill in the art upon examination of this disclosure, including the figures and detailed description. It is intended that all such additional systems methods, features and advantages be included within this description, be within the scope of aspects of the invention, and the novel and unobvious aspects be protected by the accompanying claims.

BRIEF DESCRIPTION OF THE DRAWINGS

Aspects of the invention can be better understood with reference to the accompanying figures. The components in the figures are not necessarily to scale, with emphasis instead being placed upon illustrating the principles of aspects of the invention. In the figures, like reference numerals designate corresponding parts throughout the different views.

DETAILED DESCRIPTION

The present invention provides a vertically structured LED that integrates a nitride semiconductor light emitting component with at least one conductive Zn(Mg,Cd,Be)O(S,Se) assembly. The nitride semiconductor light emitting component is integrated with the conductive Zn(Mg,Cd,Be)O(S,Se) assembly or Zn(Mg,Cd,Be)O(S,Se) assemblies such that the effective current injection area or light emitting area 310 is significantly enhanced. In the vertically structured LED, a portion of the said conductive Zn(Mg,Cd,Be)O(S,Se) assembly or Zn(Mg,Cd,Be)O(S,Se) assemblies may be doped with at least one of the transition metals or rare earth ions of various types as a phosphor host, therefore the present invention is also a vertical injection apparatus capable of emitting high brightness light with colors of white, ultraviolet, violet, blue, green, yellow, red, and infrared.

Figure 1:
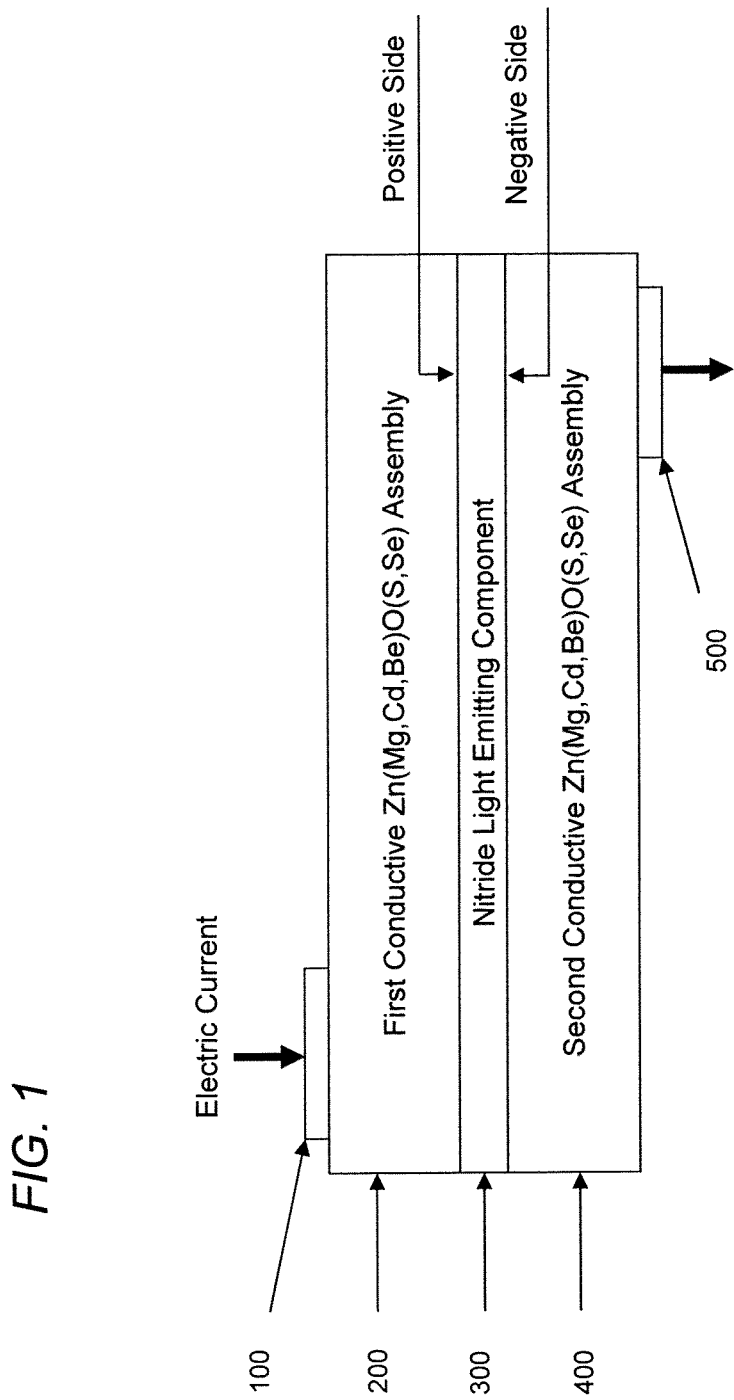
FIG. 1 is a cross-sectional diagram of a vertically structured LED according to the present invention.

FIG. 1 shows an embodiment of structure in accordance with aspects of the invention. The structure is composed of a positive electrode 100, a first conductive Zn(Mg,Cd,Be)O(S, Se) assembly 200, a nitride semiconductor light emitting component 300, a second conductive Zn(Mg,Cd,Be)O(S,Se) assembly 400, and a negative electrode 500. In some embodiments the first conductive Zn(Mg,Cd,Be)O(S,Se) assembly comprises ZnO, or some other member of the Zn(Mg,Cd,Be)O(S,Se) family. Similarly, in some embodiments the second conductive Zn(Mg,Cd,Be)O(S,Se) assembly comprises ZnO, or some other member of the Zn(Mg,Cd,Be)O(S,Se) family. As shown in FIG. 1, the first conductive Zn(Mg,Cd)O(S,Se) assembly and the second conductive Zn(Mg,Cd)O(S,Se) assembly sandwich the nitride semiconductor light emitting component. The positive electrode is coupled to the first conductive Zn(Mg,Cd,Be)O(S,Se) assembly, on a side opposite the nitride semiconductor light emitting component. Similarly, the negative electrode is coupled to the second conductive Zn(Mg,Cd)O(S,Se) assembly, also on a side opposite the nitride semiconductor light emitting component. Other structures will become apparent to one with skill in the art upon understanding the spirit of various aspects of the invention.

The II-VI semiconductor family Zn(Mg,Cd,Be)O(S,Se) is a material that may be used for fabrication of a vertically structured LED with the insulator, sapphire substrate 401 removed. Among the said II-VI semiconductor family, ZnO is a typical representative. ZnO is a wide bandgap semiconductor, transparent with respect to visible light, and can be conductive when doped with certain elements. In contrast to SiC, ZnO has several advantages, including but not limited to the following. First, bulk growth of ZnO is relatively easy as the melting point of ZnO is significantly lower (1975° C.), therefore, the cost of a ZnO wafer is believed much lower as the market grows. Second, the a and c lattice parameter mismatches between ZnO and GaN are very low (1.9% and 0.5%, respectively) and are much less than those between SiC and GaN. This could potentially lead to significant improvement of the reliability of the said nitride LEDs. Third, ZnO has a wider bandgap than SiC resulting in a wider transparent range in the light spectrum. Furthermore, highly conductive ZnO films can be easily achieved. For example, highly conductive ZnO films for this invention have been successfully grown with resistivities as low as $2.5 \times 10^{-4}$ Ω·cm.

In another aspect, single-phase $Zn_{1-a}Mg_aO$, $Zn_{1-b}Cd_bO$, and $Zn_{1-c}Be_cO$ ternaries of various compositions have been successfully achieved with crystallographic structures similar to that of GaN. In particular, the a-axis lattice mismatches of $Zn_{1-a}Mg_aO$ and $Zn_{1-b}Cd_bO$, with compositions a<33% and b<7% have been measured less than 0.4% with respect to GaN (See, "Band gap engineering based on $Mg_xZn_{1-x}O$ and $Cd_yZn_{1-y}O$ ternary alloy films", T. Makino, Y. Segawa, M. Kawasaki, A. Ohtomo, R. Shiroki, K. Tamura. and T. Yasuda, Appl. Phys. Lett. 78, (2001) 1237, incorporated by reference herein). Other ternaries $Zn_{1-c}Be_cO$, $ZnO_{1-p}S_p$, $ZnO_{1-q}Se_q$, etc., may also have crystallographic structures similar to GaN. Therefore, the Zn(Mg,Cd,Be)O(S,Se) family, for example ZnO, $Zn_{1-a}Mg_aO$, $Zn_{1-b}Cd_bO$, $Zn_{1-c}Be_cO$, $ZnO_{1-p}S_p$, and $ZnO_{1-q}Se_q$ can also be used to form the vertical LED, in addition to, for example, ZnO.

Unlike sapphire and SiC for which etching is very difficult, most Zn(Mg,Cd,Be)O(S,Se) materials are amenable to etching, especially wet chemical etching—a process that could lead to lower manufacture cost. Patterns of various shapes can be formed on most Zn(Mg,Cd,Be)O(S,Se) films or wafers by wet etching using various acids, some bases, and even some salt solutions with low cost. This property can be employed for the roughening step in LED manufacture process, which can significantly enhance light extraction (See, e.g. "Improved Light Extraction in AlGaInP-Based LEDs Using a Roughened Window Layer", Ray-Hua Horng, Tzong-Ming Wit, and Dong-Sing Wuu, Journal of The Electrochemical Society, 155 (10), (2008) H710-H715 incorporated for all purposes by referenced herein).

Figure 2:
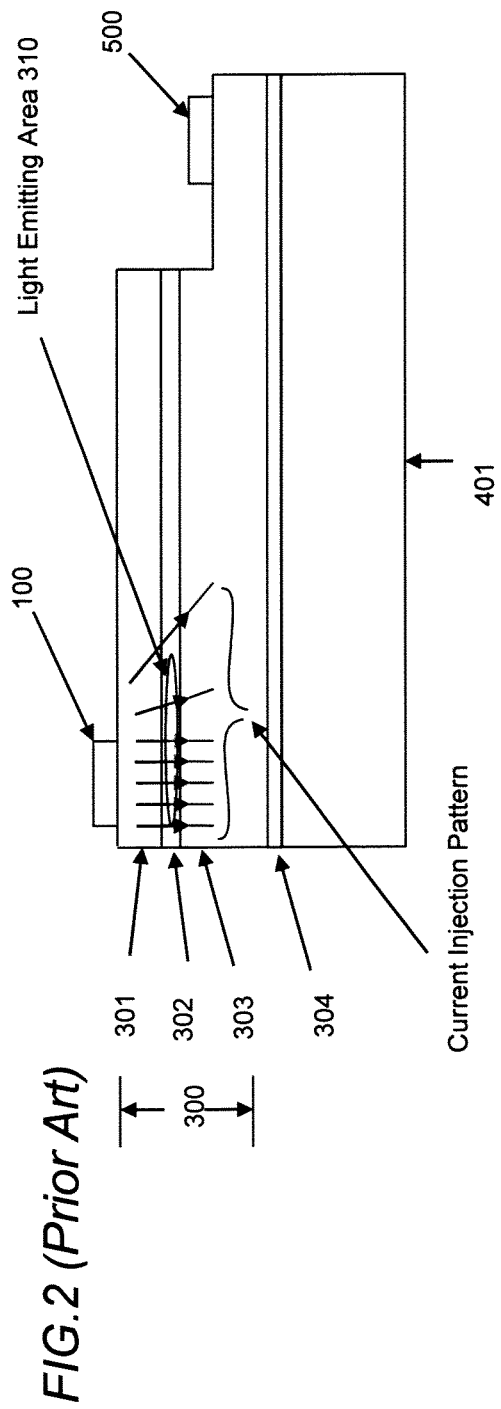
FIG. 2 is a cross-sectional diagram of an LED structure grown on a sapphire substrate, showing the localized current injection pattern.
Figure 3:
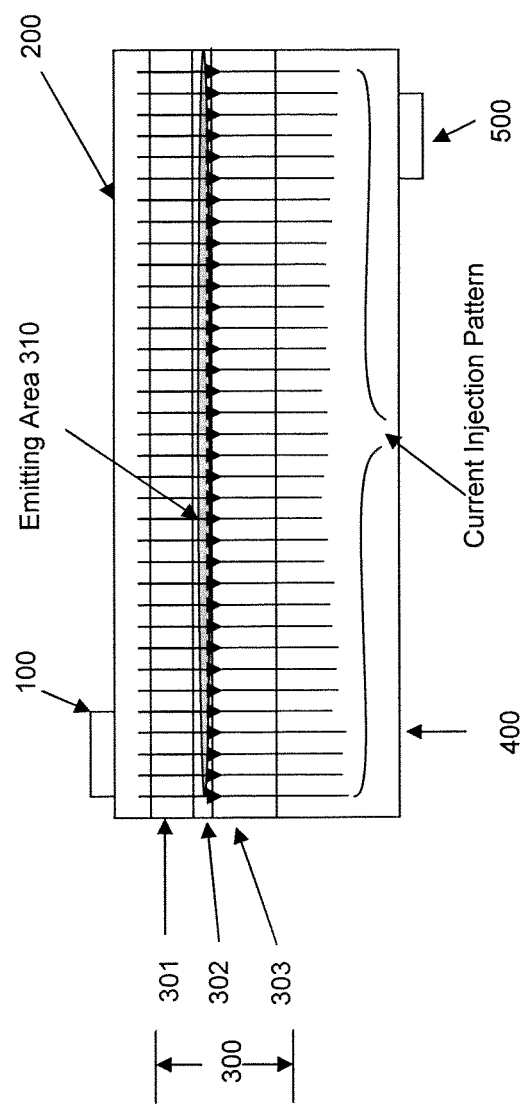
FIG. 3 is a cross-sectional diagram of an LED integrated with conductive Zn(Mg,Cd,Be)O(S,Se) assemblies, showing significantly enlarged current injection pattern.

The conductive Zn(Mg,Cd,Be)O(S,Se) assemblies enlarge the effective current injection area or light emitting area 310, enhancing the wall-plug efficiency of the device. This effect can be seen more explicitly in FIG. 3, where the injected current pattern is drawn and the light emitting component 300 is detailed. In FIG. 3, the LED has the first conductive Zn(Mg, Cd,Be)O(S,Se) assembly 200 attached to the less conductive p-type nitride semiconductor layer 301, and the second conductive Zn(Mg,Cd,Be)O(S,Se) assembly 400 replacing the insulative sapphire substrate 401. The positive electrode 100 and the negative electrode 500 form Ohmic contacts, respectively, to the first and the second conductive Zn(Mg,Cd,Be)O(S,Se) assemblies 200 and 400 sandwiching the light emitting component 300. With the conductive Zn(Mg,Cd,Be)O(S, Se) assemblies, injected current is effectively spread beyond the electrode (100 and 500) areas. The areas mentioned here have the same normal as that of the sapphire substrate surface. Therefore, the effective current injection area or light emitting area 310 can be approximately equal to the area of the p-type nitride semiconductor 301 or the area of the active region 302 where radiative recombination takes place, significantly larger than that as shown in FIG. 2. Accordingly, the area for light extraction can be enhanced approximately equal to the area of the p-type nitride semiconductor 301. As a result, the wall plug in efficiency is greatly improved.

The said first conductive Zn(Mg,Cd,Be)O(S,Se) assembly or the second conductive Zn(Mg,Cd,Be)O(S,Se) assembly can contain several conductive Zn(Mg,Cd,Be)O(S,Se) layers or bulks of various shapes, or can only be one conductive Zn(Mg,Cd,Be)O(S,Se) layer. Each said Zn(Mg,Cd,Be)O(S,Se) layer or bulk may have any of Zn, Mg, Cd, Be, S, and Se composition the same or different from others. The said conductive layers or bulks are typically n-type, but could be p-type. The two electrodes 100 and 500 are preferably metal alloys composed of Ti, Au, or TiAu alloy. They can also be other metals or alloys including Al, TiAl, Ni, NiAl, NiAu, Cr, CrAu, and the like that can form ohmic contact to the Zn(Mg,Cd,Be)O(S,Se).

The light emitting component 300 is a combination of epitaxial semiconductors and is preferably grown by MOCVD or MBE. It is preferably composed of, in successive layers, an n-type nitride semiconductor 303, an active region 302 made from nitrides and containing a single quantum well or multiple quantum wells, and a p-type nitride semiconductor 301. Here the said nitrides are group III nitride semiconductors satisfying the formula $Al_xGa_yIn_{1-x-y}N$, inclusive of x=0, y=0, and x=y=0. As known to some other electronic structures, a quantum well is a well of potentials which localizes both electrons and holes. Recombination of electrons and holes in the well(s) results in light emission. The well(s) is formed by thin layers of nitride semiconductors satisfying the formula $Al_xGa_yIn_{1-x-y}N$, inclusive of x=0, y=0, and x=y=0. By adjusting the well width and the compositions, namely x and y of the said formula $Al_xGa_yIn_{1-x-y}N$, inclusive of x=0, y=0, and x=y=0, the light emitted from the active region can be ultraviolet, violet, blue, green, yellow, red, and infrared. Generally, the said light emitting component 300 can comprise of other layers or configurations for improved quantum efficiency, which may contain quantum dots as the active media. In addition, the light emitting component 300 has polarity because it contains a p-n junction. A positive side and a negative side are thus defined for the light emitting component 300 with the positive side referred to the p side and the negative side referred to the n side of the p-n junction, respectively, as shown in FIG. 1.

A sacrificial substrate is employed for the growth of the light emitting component 300. This sacrificial substrate should be removed after the first conductive Zn(Mg,Cd,Be)O(S,Se) assembly is formed on the light emitting component 300. The preferable sacrificial substrate is sapphire or silicon, but in various embodiments could be any from a group including but not limited to SiC, Ge, Zn(Mg,Cd,Be)O(S,Se), $LiAlO_2$, $MgAl_2O_4$, $ScAlMgO_4$, $Al_{1-x-y}In_xGa_yN$ (where x=0~1, y=0~1), InP, GaAs, quartz, and glass.

Prior to the growth of the light emitting component 300, a thin buffer layer is preferably deposited on the said sacrificial substrate. It can be formed by MOCVD, MBE, VPE, thermal evaporation, e-beam evaporation, PLD, or sputter. Other deposition methods may also be used. Although the said thin buffer layer is primarily to improve the crystallinity of the light emitting component 300 grown thereon, it may also act as an etch stop for etch removal of the said sacrificial substrate. The material of the buffer layer can comprise one of any of nitride semiconductors satisfying the formula $Al_xGa_yIn_{1-x-y}N$, inclusive of x=0, y=0, and x=y=0, silicon nitride, silicon oxide, silicon carbide, zirconium nitride, zirconium oxide, zirconium carbide, and others. As the thin buffer layer may be electrically highly resistive and adversely affect LED performance, it needs to be removed to expose the n-type nitride semiconductor 303 that is electrically conductive. The methods to remove the thin buffer layer generally include dry and wet etching.

The first and second conductive Zn(Mg,Cd,Be)O(S,Se) assemblies 200 and 400 are preferably intentionally doped for conduction improvement but could comprised of undoped Zn(Mg,Cd,Be)O(S,Se) since most unintentionally doped Zn(Mg,Cd,Be)O(S,Se) films and bulks are of n-type and conductive. The doping sources for conductive Zn(Mg,Cd)O(S,Se) are preferably Ga compounds, Al compounds, or elemental Ga and Al metals and their alloys. Other effective doping sources for conductive Zn(Mg,Cd,Be)O(S,Se) include but are not limited to the compounds of In, B, Tl, Zn, Cu, Ag, Au, C, Si, Ge, N, P, As, Sb, Pb, F, Cl, Br, and I, or their elemental forms. Although for most cases, the doping is done with one doping source, it could be done with two sources or more. The first conductive Zn(Mg,Cd,Be)O(S,Se) assembly 200 preferably comprises one highly conductive Zn(Mg,Cd,Be)O(S,Se) layer that attaches onto the positive side of the nitride light emitting component 300 grown on a sacrificial substrate using MOCVD.

Furthermore, at least a layer or a portion of the said Zn(Mg,Cd,Be)O(S,Se) assemblies 200 and 400 may be doped with phosphors, forming a compact LED with color conversion and blending function. The Zn(Mg,Cd,Be)O(S,Se) hosted phosphors therein absorb the light emitted from the nitride active region 302 and re-emit light with characteristic wavelengths or colors of their own, which are different from the color of the original light emitted from the nitride active region 302. As a result, the output light of the LED has a color after blending the phosphor-reemitted light and the original light from the nitride active region 302. One particular application is white light generation. White light can be generated, for example, by blending light from a blue LED and phosphors excited by the blue LED for green and red emission, or by blending lights from a blue LED and phosphors excited by the blue LED for yellow emission. $Ce^{3+}$ and $Eu^{2+}$ could be phosphor sources for the green and red emissions, respectively. (See. "$Ce^{3+}/Eu^{2+}$ codoped with $Ba_2ZnS_3$: A blue radiation-converting phosphor for white light-emitting diodes", Woan-Jen Yang and Teng-Ming Chen, Appl. Phys. Lett. 90. (2007) 171908, incorporated by reference herein). Zn, Tb, Cu, and other transition metals or rare earth ions of various types can also be effective phosphor sources. Using the Zn(Mg,Cd,Be)O(S,Se)-hosted phosphors, the color of the output light of the LED can generally be white, infrared, red, green, yellow, blue, violet, and ultraviolet portions of the electromagnetic spectrum, depending on the characteristic wavelengths of the specific phosphors doped, the absorption effect of the phosphors, and the color and the brightness of the original light from the said nitride active region 302.

Figure 4A:
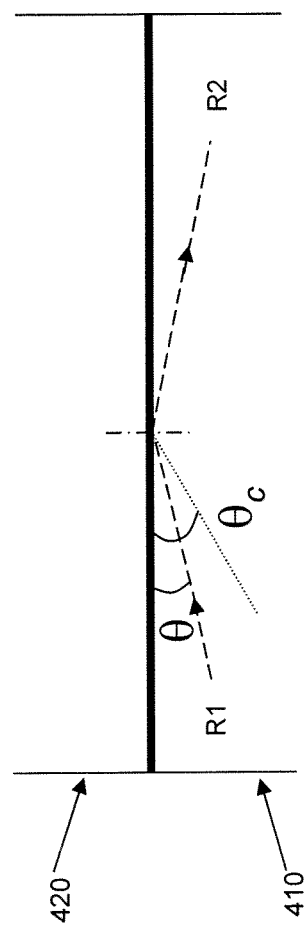
FIG. 4*a* is a schematic drawing showing the optical phenomenon of total internal reflection.
Figure 4B:
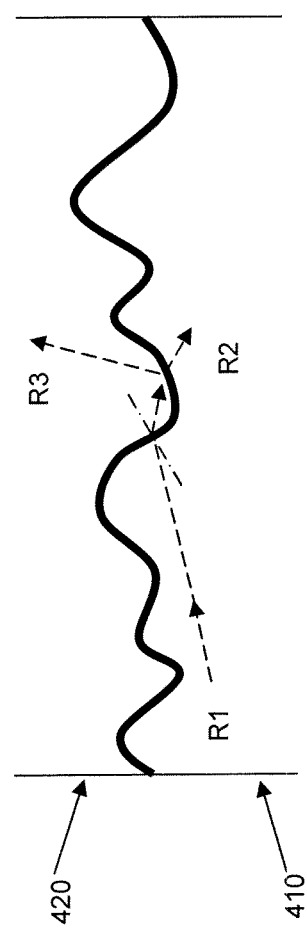
FIG. 4*b* is a schematic drawing showing how light extraction is enhanced with a roughened interface.

Moreover, a roughening process can be applied on the surfaces or at the interfaces of the vertical LED structure to improve the LED brightness. Schematically shove in FIG. 4a, total internal reflection occurs when a ray R1 striking a flat interface with the angle of incidence θ less than the critical angle θc determined by the refractive indexes of the two media 410 and 420 that form the interface. The light outcoupling efficiency from a GaN flat surface to air is estimated to be only ~3% for a nitride LED because of the total internal reflection (Ref. "Integrated ZnO nanotips on GaN light emitting diodes for enhanced emission efficiency", J. Zhong, H. Chen, G. Saraf, and Y. Lu, Appl. Phys. Lett. 90, (2007) 203515, incorporated herein by reference). However, light extraction can be significantly enhanced if a roughened surface or interface is employed. In this case, the incident angle could locally become more than the critical angle θc at the incident point, as shown by FIG. 4b. In some embodiments, a roughening process may or may not be employed at the interface between the first conductive Zn(Mg,Cd,Be)O(S,Se) assembly 200 and the light emitting component 300. If necessary, the roughening at the interface can be realized by controlling the growth conditions such as growth temperature, growth pressure, and flows of the carrier gas and precursors. Other roughening methods, such as wet chemical etch or dry etch, can also be used. In addition, in various embodiments the roughening process can not only be applied to the interface between the first conductive Zn(Mg,Cd,Be)O(S,Se) assembly 200 and the light emitting component 300, but also any other surfaces or interfaces of the vertical LED structure to improve the LED brightness, as long as optical refractive indexes of the two materials on the two sides of the surface or the interface is significantly different.

In other aspects of this invention, the first electrode 100 and the second electrode 500 can be made with various areas and shapes, depending on specific embodiments of the present invention. In general, if the majority of the light is extracted from the upper side via the top surface of the first conductive Zn(Mg,Cd,Be)O(S,Se) assembly 200, the area of the first electrode 100 connecting to the first conductive Zn(Mg,Cd,Be)O(S,Se) assembly 200 is preferably less than 20% of the total top surface area of the first conductive Zn(Mg,Cd,Be)O(S,Se) assembly. The second electrode 500 preferably covers the whole bottom surface of the second conductive Zn(Mg,Cd,Be)O(S,Se) assembly 400. The second electrode 500 can act as a reflection mirror such that incident light can be reflected back towards the surface designed to efficiently extract the light. The total thickness of the second electrode 500 should be more than 10 nm and typically less than 500 nm. However, it could be of several hundreds of microns. In this case the second electrode 500 is also used as a heat sink for heat dissipation. Vice versa, if the majority of the light is extracted from the bottom side via the bottom surface of the second conductive Zn(Mg,Cd,Be)O(S,Se) assembly 400, the area of the second electrode 500 is preferably less than 20% of the total bottom surface area of the second conductive Zn(Mg,Cd,Be)O(S,Se) assembly 400. The first electrode 100 preferably covers the whole top surface of the first conductive Zn(Mg,Cd,Be)O(S,Se) assembly 200. The first electrode 100 can act as the reflection mirror such that incident light can be reflected back towards the surface designed to efficiently extract the light. The total thickness of the second electrode 100 should be more than 10 nm but typically less than 500 nm. However, the second electrode 100 could have a thickness in the range of several hundreds of microns or more so that it can also be used as a heat sink.

The vertically structured LED and formation methods according to the present invention are further explained in the following embodiments, but these are not to be construed to limit the scope thereof.

Figure 5:
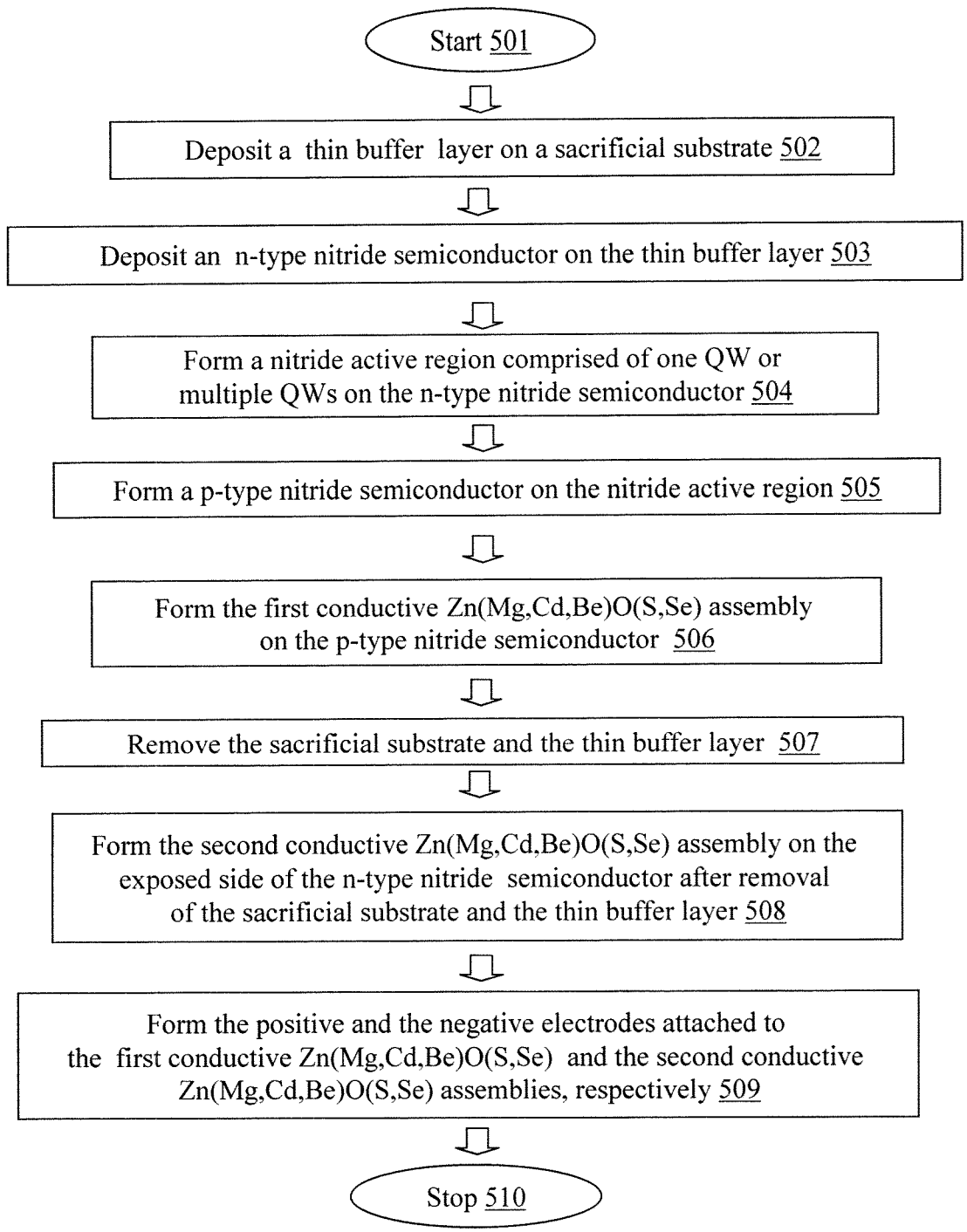
FIG. 5 shows a flow chart illustrating how a vertically structured LED integrated with two conductive Zn(Mg,Cd,Be)O(S,Se) assemblies is formed.
Figure 6B:
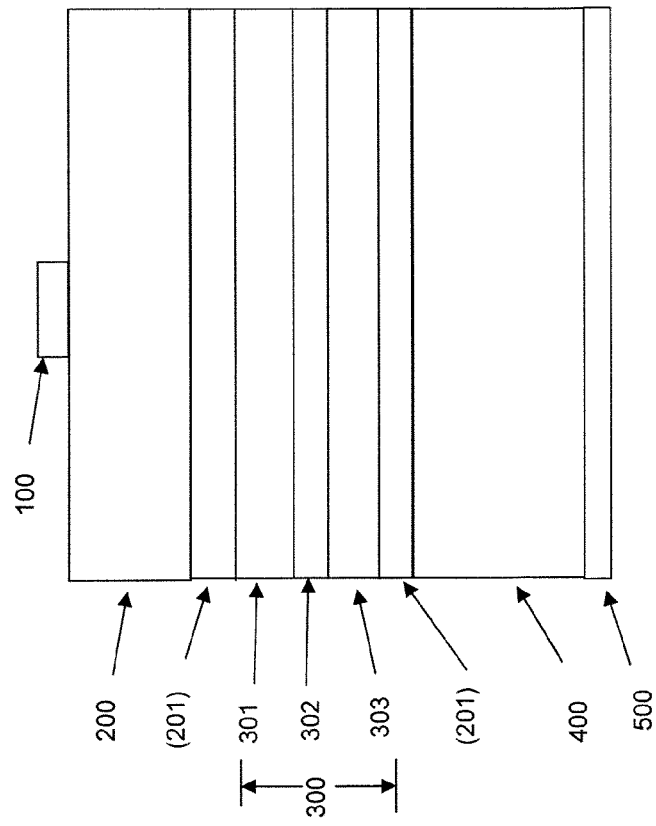
FIGS. 6*a* and 6*b* illustrate cross-sectional views of two vertically structured LED styles according to a first embodiment of this invention, with 6*a* for a bottom emission style and 6*b* for a top emission style, respectively.
Figure 6A:
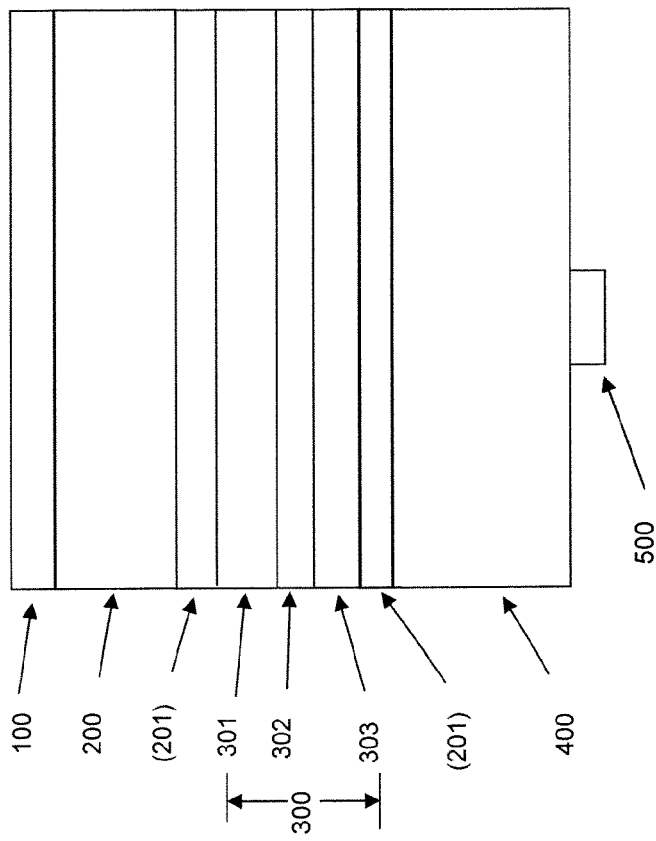

FIG. 5 is a flow chart showing an embodiment of a process for forming a vertically structured LED integrated with two conductive Zn(Mg,Cd,Be)O(S,Se) assemblies in accordance with aspects of the invention. Schematic LED structures based on the method described in FIG. 5 are shown in FIG. 6a and FIG. 6b with FIG. 6a for a bottom emission style and FIG. 6b for a top emission style, respectively.

Refer to FIG. 5, the light emitting component 300 includes, but is not limited to an n-type nitride semiconductor 303, an active region 302 made from nitrides and containing a single quantum well or multiple quantum wells that are doped or undoped, and a p-type nitride semiconductor 301. As described from block 501 to block 505, a thin buffer layer 304 and these nitride semiconductors (303, 302, and 301) of the light emitting component 300 were subsequently grown on a sacrificial substrate using a preferable growth method, MOCVD. Other growth methods such as HVPE or MBE may also be used. Here the said nitride is any group III nitride compound semiconductor satisfying the formula $Al_xGa_yIn_{1-x-y}N$, inclusive of x=0, y=0, and x=y=0. The preferable sacrificial substrate is sapphire or silicon, but could be else. Since the thin buffer layer 304 is primarily used for improving the crystallinity of the nitrides grown thereon and may also be used as an etch stop for the sacrificial substrate removal, selection of the buffer layer material relies on considerations for both. If the substrate material is sapphire, then the thin buffer layer 304 is preferably GaN, while if the substrate material is silicon, then the thin buffer layer 304 can be a combination of thinner AlN and thinner $SiN_x$ layers (See e. g., "High-performance III-nitride blue LEDs grown and fabricated on patterned Si substrates", B. Zhang, H. Liang, Y. Wang, Z. Feng, K. W. Ng, and K. M. Lau, Journal of Crystal Growth 298, (2007) 725-730, incorporated herein by reference.). Additionally, the said light emitting component 300 may include an $n^+$ nitride layer grown on the said p-type nitride semiconductor 301. The top layer (with exposed surface) of the light emitting component 300 can be flat or roughened.

In somewhat more detail, in block 502 a thin buffer layer is deposited on a sapphire substrate or a silicon substrate. In block 503 an n-type nitride semiconductor is deposited on the buffer layer. In block 504 a nitride active region including one or more quantum wells is formed on the n-type nitride semiconductor. In block 505 a p-type nitride semiconductor is formed on the nitride active region.

In block 506, the first conductive Zn(Mg,Cd,Be)O(S,Se) assembly 200 is formed on the light emitting component 300 with a flat surface or a roughened surface. This is realized by depositing a highly conductive Zn(Mg,Cd,Be)O(S,Se) film on the light emitting component 300, followed by wafer-bonding a conductive Zn(Mg,Cd,Be)O(S,Se) bulk substrate onto the said highly conductive Zn(Mg,Cd,Be)O(S,Se) film. The said highly conductive Zn(Mg,Cd,Be)O(S,Se) film is preferably Ga-doped or Al-doped and grown by MOCVD, but could be grown by other methods such as MBE, sputtering, PLD, evaporation, CVD, or the like. The conductive Zn(Mg,Cd,Be)O(S,Se) substrate is about 150 μm thick with a portion doped with phosphors. Other thickness of the said conductive Zn(Mg,Cd,Be)O(S,Se) substrate is also possible. In this embodiment, the first conductive Zn(Mg,Cd,Be)O(S,Se) assembly is composed of the highly conductive Zn(Mg,Cd,Be)O(S,Se) film and the conductive Zn(Mg,Cd,Be)O(S,Se) bulk substrate.

The wafer-bonding is a technique to firmly join two separate substances together. Each of the two substances preferably has at least one flat surface that could be used as the bonding interface. In the present invention, the two separate substances are either Zn(Mg,Cd,Be)O(S,Se) or nitride semiconductor. In this wafer bonding process, the said two substances are pressed into contact at room temperature first with an apparatus, such as a vise, a weight, or the like, called initial bonding. Then they are heated up to the bonding temperature preferably of 800° C. where atomic bonds can be formed at the interface between the two substances. The time duration at the said bonding temperature is 15 minutes, but could be longer or shorter. Other bonding temperatures above 300° C. may also be used. This thermal process is preferably done in a vacuum apparatus, however it may also be done in an environment comprising, for example, $N_2O$, $SO_2$, $H_2S$, $H_2Se$, $NH_3$, $H_2$, oxygen, ozone, water vapor, hydrogen peroxide vapor, $N_2$, He, Ne, or Ar. Additionally, an additional layer 201 may be used to improve the bonding interface. This additional layer 201 can be a thin layer of metal such as Al, Ga, and In or a metal alloy, preferably with a thickness less than 100 nm. It can also be a transparent conductive film, such as NiO or ITO. After the wafer-bonding process, the additional layer 201 may disappear because the elements in the additional layer 201 could diffuse into or react with the two substances, namely Zn(Mg,Cd,Be)O(S,Se) or nitride, during the thermal process. This additional layer 201 should not significantly impede light transmission after the bonding process.

After the first conductive Zn(Mg,Cd,Be)O(S,Se) assembly 200 is formed on the light emitting component 300, the sacrificial substrate and the thin buffer layer are then removed in block 507. If the material of the sacrificial substrate is sapphire, then the sacrificial substrate and the thin buffer layer are preferably removed using a technique called laser lift-off (LLO). In some embodiments, a pulsed laser is employed for the LLO process with the wavelength of the dominant emission tuned to 266 nm. The exposed backside of the sapphire substrate 401 is polished so that scattering of the laser beam for the LLO is minimized. Then, the polished sapphire surface is exposed to the 266 nm laser beam with the beam diameter expanded. This laser beam penetrates the sapphire 401 and strikes the interface between the thin buffer layer 304 and the sapphire substrate 401. The thin buffer layer 304 preferably made from GaN usually decomposes after absorption of the laser beam, yielding mainly metal Ga droplets and nitrogen gas domains at the interface. After this, the sapphire substrate 401 is lifted off or removed on a hotplate with a temperature above the melting point of Ga, 29.78° C. The wavelength of the laser beam for the LLO process can be varied, as long as it can penetrate the sapphire substrate 401 without significant absorption, but should be shorter than the intrinsic absorption wavelength (365.9 nm at room temperature for GaN) of the buffer material such that the beam can be absorbed by the buffer material at the interface between the thin buffer layer 304 and the sapphire substrate 401. A similar LLO processing has been reported by Chu et al. (Ref. "Study of GaN Light-Emitting Diodes Fabricated by Laser Lift-off Technique", Chen-Fu Chu, Fang-I Lai, Jung-Tong Chu, Chang-Chin Yu, Chia-Feng Lin, Hao-Chung Kuo, and S. C. Wang, Journal of Applied Physics 95, (2004) 3916-3922, incorporated herein by reference). After the LLO process, the n-type nitride semiconductor 303 is exposed because the thin nitride buffer layer 304 has decomposed. In another aspect, if silicon is used as the sacrificial substrate, LLO can not be used for the substrate removal because silicon is opaque to the UV laser beam. However, the silicon substrate and the thin buffer layer can be removed using, for example, an lapping and etching combined (LEC) process as follows: 1) Use a mechanical lapping method to thin the silicon wafer down to less than 50 microns with the first Zn(Mg,Cd,Be)O(S,Se) assembly protected, for example, by wax; 2) Remove the rest silicon by the well known HNA isotropic, wet etching method using the buffer layer as the etch stop (See e. g. "Fabrication of suspended GaN microstructures using GaN-on-patterned-silicon (GPS) technique", Z. Yang, R. N. Wang, S. Jia, D. Wang, B. S. Zhang, K. M. Lau, and K. J. Chen, Physica Status Solidi (a) 203, (2006) 1712-1715, incorporated herein by reference); 3) Remove the protection wax and use acetone and other solvents to clean the wax residue; 4) Remove the thin buffer layer by dry etching with a low etching rate to expose the n-type nitride semiconductor 303. (See e. g. "Hig rate etching of AlN using $BCl_3/Cl_2/Ar$ inductively coupled plasma", F. A. Khan, L. Zhou, V. Kumar, T. Adesida, and R. Okojie, Materials Science and Engineering B95, (2002) 51-54, incorporated herein by reference).

In block 508, the aforementioned wafer bonding process is employed again to wafer-bond the second conductive Zn(Mg,Cd,Be)O(S,Se) assembly 400 to the exposed surface of the n-type nitride semiconductor 303. The second conductive Zn(Mg,Cd,Be)O(S,Se) assembly 400 is preferably a 150 μm thick, conductive Zn(Mg,Cd,Be)O(S,Se) substrate with a portion doped by phosphors. The conductive Zn(Mg,Cd,Be)O(S,Se) assembly 400 can also be a Zn(Mg,Cd,Be)O(S,Se) bulk or bulks with shapes of various types, a layer or several layers of Zn(Mg,Cd,Be)O(S,Se), or their combinations.

In block 509, the positive and negative electrodes 100 and 500 are formed and connected to the first and the second conductive Zn(Mg,Cd,Be)O(S,Se) assemblies 200 and 400, respectively, as shown by FIG. 6a and FIG. 6b using conventional semiconductor device fabrication processes. Herein, the conventional semiconductor device processing generally includes, but is not limited to, lithography, evaporation, etching, CVD, and thermal annealing. FIG. 6a schematically shows an LED of this embodiment, which emits light downwards. The positive electrode 100 is used not only as an electrode but also a light reflector. For this LED, the majority of the emitted light is extracted from the second conductive Zn(Mg,Cd,Be)O(S,Se) assembly 400. In contrast, FIG. 6b schematically shows another LED of this embodiment with light emitting upwards. Therein the negative electrode 500 is used not only as an electrode but also a light reflector. Most light of the LED is extracted from the first conductive Zn(Mg,Cd,Be)O(S,Se) assembly 100.

Figure 7:
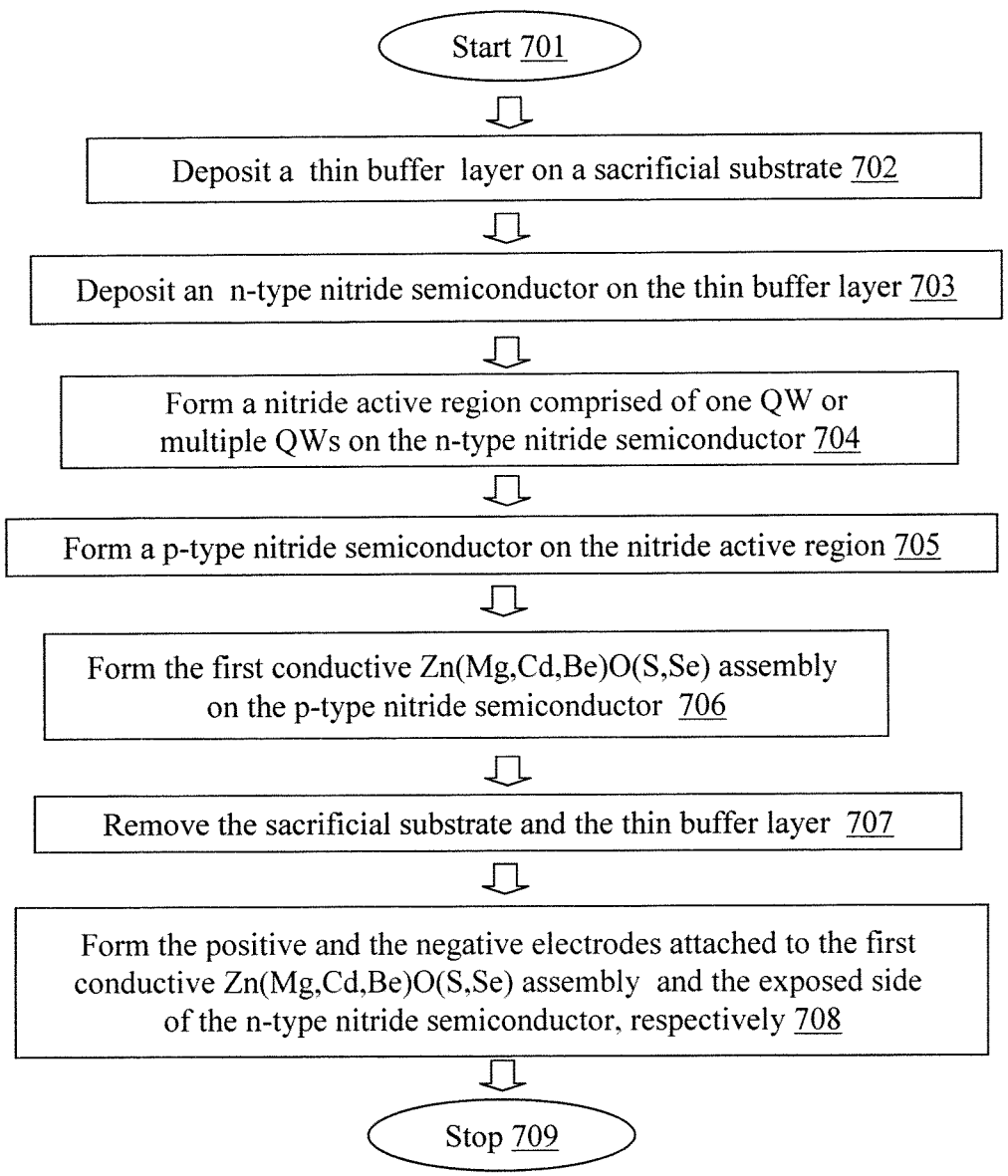
FIG. 7 shows a flow chart illustrating how the vertically structured LED integrated with one conductive Zn(Mg,Cd, Be)O(S,Se) assembly is formed.
Figure 8B:
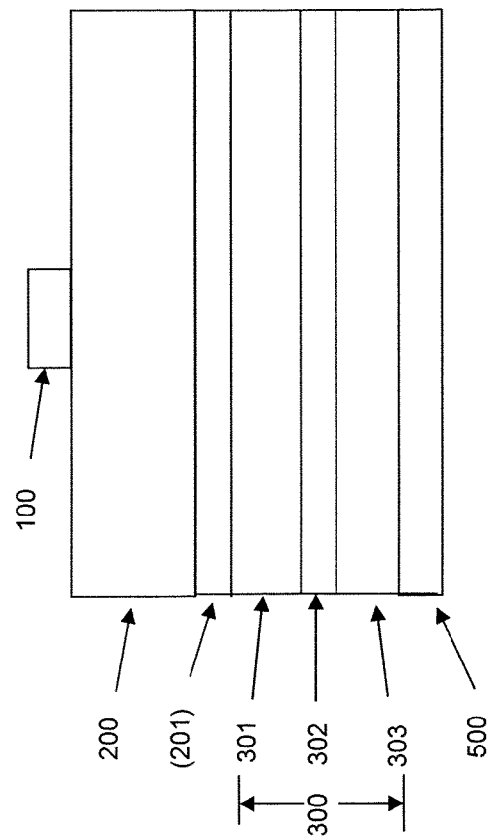
FIGS. 8a and 8b illustrate cross-sectional views of two vertically structured LED styles according to a second embodiment of this invention, with 8a for a bottom emission style and 8b for a top emission style, respectively.
Figure 8A:
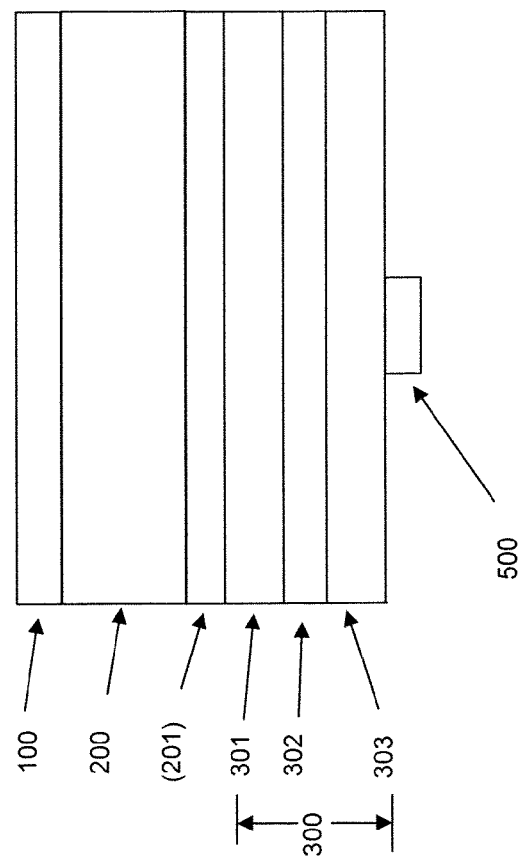

FIG. 7 is a flow chart showing an embodiment of a process of forming a vertically structured LED integrated with one conductive Zn(Mg,Cd,Be)O(S,Se) assembly in accordance with aspects of the invention. Schematic LED structures based on the method described in FIG. 7 are shown in FIG. 8a and FIG. 8b with FIG. 8a for a bottom emission style and FIG. 8b for a top emission style, respectively.

Refer to FIG. 7, the light emitting component 300 includes, but is not limited to an n-type nitride semiconductor 303, an active region 302 made from nitrides and containing a single quantum well or multiple quantum wells that are doped or undoped, and a p-type nitride semiconductor 301. As described from block 701 to block 705, a thin buffer layer 304 and these nitride semiconductors (303, 302, and 301) of the light emitting component 300 were subsequently grown on a sacrificial substrate using a preferable growth method, MOCVD. Other growth methods such as HVPE or MBE may also be used for the growth. Herein the said nitrides are any group III nitride compound semiconductors satisfying the formula $Al_xGa_yIn_{1-x-y}N$, inclusive of x=0, y=0, and x=y=0. The said sacrificial substrate is preferably a sapphire substrate or a silicon substrate, but could be else. And the material of the thin buffer layer 304 generally depends on the substrate type. If the substrate material is sapphire, then the thin buffer layer 304 is preferably GaN, while if the substrate material is silicon, then the thin buffer layer 304 can be a combination of thinner AlN and thinner SiN, layers. Additionally, the said light emitting component 300 may include an $n^+$ nitride layer grown on the said p-type nitride semiconductor 301. The top layer (with exposed surface) of the light emitting component 300 can be flat or roughened.

In block 706, the first conductive Zn(Mg,Cd,Be)O(S,Se) assembly 200 is formed on the surface of the said light emitting component 300. This is realized by depositing a highly conductive Zn(Mg,Cd,Be)O(S,Se) film on the light emitting component 300, followed by wafer-bonding a conductive Zn(Mg,Cd,Be)O(S,Se) bulk substrate onto the said highly conductive Zn(Mg,Cd,Be)O(S,Se) film. The surface of the said light emitting component 300 can be flat or roughened. The said highly conductive Zn(Mg,Cd,Be)O(S,Se) film is preferably Ga-doped or Al-doped and grown by MOCVD, but could be grown by other methods such as MBE, sputtering, PLD, or the like. The said conductive Zn(Mg,Cd,Be)O(S,Se) substrate is about 150 μm thick with a portion doped with phosphors. Other thickness of the said conductive Zn(Mg,Cd,Be)O(S,Se) substrate is also possible. The first conductive Zn(Mg,Cd,Be)O(S,Se) assembly herein is composed of the said highly conductive Zn(Mg,Cd,Be)O(S,Se) film and the said conductive Zn(Mg,Cd,Be)O(S,Se) bulk substrate.

In block 707, the said sacrificial substrate and the thin buffer layer thereon are then removed. Sapphire and silicon are the preferable substrates. If sapphire is used, then it can be removed preferably using the said laser lift-off (LLO) technique. The n-type nitride semiconductor 303 is exposed after the LLO process because the thin nitride (GaN) buffer layer 304 has decomposed during the LLO process. In another aspect, if silicon is used, the substrate and the thin buffer layer can be removed using the said LEC process.

Then in block 708, the positive and negative electrodes 100 and 500 are formed connecting to the first conductive Zn(Mg,Cd,Be)O(S,Se) assembly and the exposed n-type nitride 303, respectively, as shown by FIG. 8a and FIG. 8b using conventional semiconductor device fabrication process. Herein, the said conventional semiconductor device processing includes, but is not limited to, lithography, evaporation, etching, CVD, and thermal annealing. FIG. 8a schematically shows an LED of this embodiment, which emits light downwards. In this configuration, the positive electrode 100 is used not only as an electrode but also a light reflector. The majority of light is extracted from the n-type nitride semiconductor 303. In contrast, FIG. 8b schematically shows another LED of this embodiment with light emitting upwards. Therein the negative electrode 500 is used not only as an electrode but also a light reflector. Most light of the LED is extracted from the first conductive Zn(Mg,Cd,Be)O(S,Se) assembly 100.

Figure 9:
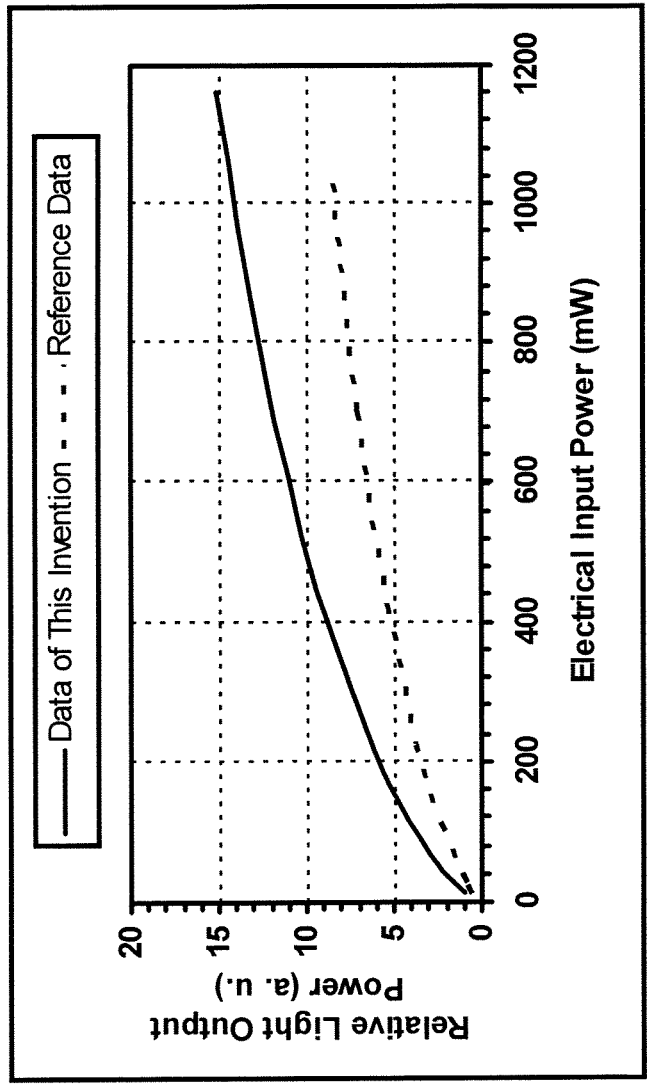
FIG. 9 is a comparative plot of the light output power of diodes according to the present invention and those of reference diodes drawn as functions of input electrical power.
Figure 10:
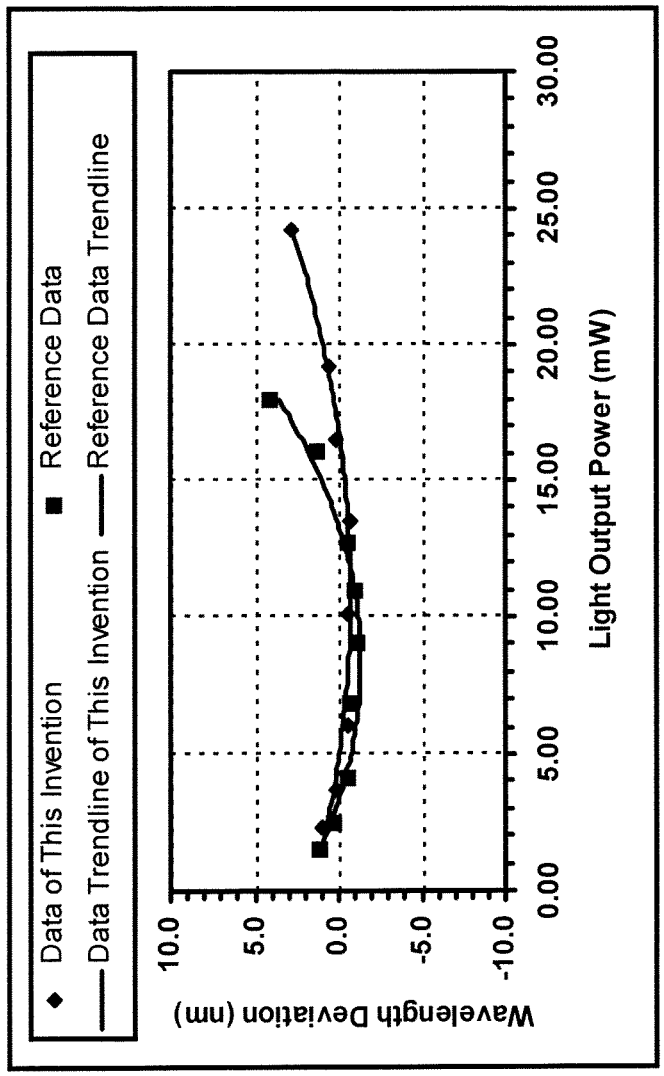
FIG. 10 is a plot of emission wavelength deviation versus light output power for diodes according to the present invention, in contrast to those of reference diodes.

FIG. 9 and FIG. 10 illustrate some of the advantages of the LEDs designed and manufactured according to the present invention. These two figures illustrate data measured from the said LEDs of the present invention and the reference LEDs, respectively. The reference LEDs were manufactured based on the conventional LED structure as shown in FIG. 2. For comparison, the said LEDs of the present invention and the said reference LEDs employed the same light emission component 300, grown in the same MOCVD growth run. FIG. 9 shows the said LEDs of the present invention are brighter and more efficient than the said reference LEDs, as shown by higher light output power at a given input electrical power. FIG. 10 shows the said LEDs of the present invention are more color stable. Given a specified emission wavelength tolerance of ±3 nm, the said LEDs of the present invention have a larger operational light output power range from 0 to 23 mW, while the said reference LEDs have a lower operational light output power range from 0 to 15 Mw.

Although the present invention has been described in considerable detail with reference to certain preferred embodiments thereof, other versions are possible. Other LED structures integrating nitride semiconductor lighting component with conductive Zn(Mg,Cd,Be)O(S,Se) can also be envisioned by one skilled in the art. The new LED can have different arrangements of Zn(Mg,Cd,Be)O(S,Se) layers or assemblies, different methods of integrating Zn(Mg,Cd,Be)O(S,Se) and nitride semiconductor, different growth methods of Zn(Mg,Cd,Be)O(S,Se) and nitride semiconductor layers, different doping methods, different roughening features, and different locations of the roughened surfaces. Therefore, the spirit and scope of the appended claims should not be limited to the preferred embodiments described herein.

What is claimed is:

1. A method of forming a light emitting diode (LED), comprising:
   forming a thin buffer layer on a sacrificial substrate;
   forming a light-emitting component made from nitride semiconductors satisfying the formula $Al_xGa_yIn_{1-x-y}N$, inclusive of x=0, y=0, and x=y=0, on the thin buffer layer;
   forming a conductive Zn(Mg,Cd,Be)O(S,Se) assembly that has a n-doped Zn(Mg,Cd,Be)O(S,Se) layer on a nitride semiconductor of the light emitting component such that the conductive Zn(Mg,Cd,Be)O(S,Se) assembly is directly in contact with the nitride semiconductor of the light-emitting component, by depositing a Zn(Mg,Cd,Be)O(S,Se) film on the nitride semiconductor and wafer bonding a Zn(Mg,Cd,Be)O(S,Se) bulk onto the Zn(Mg,Cd,Be)O(S,Se) film;
   removing the sacrificial substrate and the thin buffer layer to expose a negative side of the light emitting component;
   forming a positive electrode coupled to the conductive Zn(Mg,Cd,Be)O(S,Se) assembly; and
   forming a negative electrode coupled to the negative side of the light emitting component.

2. The method of forming an LED of claim 1, further comprising:
   forming a further conductive Zn(Mg,Cd,Be)O(S,Se) assembly on the negative side of the light emitting component;
   and wherein forming the negative electrode coupled to the negative side of the light emitting component comprises forming the negative electrode coupled, by way of the further conductive Zn(Mg,Cd,Be)O(S,Se) assembly, to the negative side of the light emitting component.

3. The method of forming an LED of claim 1, wherein forming the light-emitting component comprises:
   growing an n-type nitride semiconductor;
   growing a nitride active region on the n-type nitride semiconductor; and
   growing a p-type nitride semiconductor on the nitride active region.

4. The method of forming an LED of claim 1, wherein the thin buffer layer comprises at least one thin layer of any of nitride semiconductors satisfying the formula $Al_xGa_yIn_{1-x-y}N$ inclusive of x=0, y=0, and x=y=0, , silicon nitride, silicon oxide, silicon carbide, zirconium nitride, zirconium oxide, and zirconium carbide.

5. The method of forming an LED of claim 4, wherein growing a thin buffer layer on the sacrificial substrate comprises growing a thin buffer layer on the sacrificial substrate using a deposition method from the group of metal organic chemical vapor deposition (MOCVD), molecular beam epitaxy(MBE), pulsed laser deposition (PLD), chemical vapor deposition (CVD), evaporation, and sputter.

6. The method of forming an LED of claim 1, wherein said sacrificial substrate is made from sapphire, Si, SiC, Ge, Zn(Mg,Cd,Be)O(S,Se), $LiAlO_2$, $MgAl_2O_4$, $ScAlMgO_4$, $Al_{1-x-y}In_xGa_yN$ (where $0 \leq x \leq 1, 0 \leq y \leq 1$), InP, GaAs, quartz, or glass.

7. The method of forming an LED of claim 1, wherein removing the sacrificial substrate and the thin buffer layer to expose a negative side of the light emitting component comprises at least one process from the group including laser lift-off, mechanical lapping, wet etching, and dry etching.

* * * * *